United States Patent
Inoue et al.

(10) Patent No.: US 10,771,032 B2
(45) Date of Patent: Sep. 8, 2020

(54) METHOD FOR MANUFACTURING PIEZOELECTRIC THIN-FILM ELEMENT

(71) Applicants: PIEZO STUDIO INC., Sendai-shi, Miyagi (JP); TOHOKU UNIVERSITY, Sendai-shi, Miyagi (JP)

(72) Inventors: Kenji Inoue, Sendai (JP); Akira Yoshikawa, Sendai (JP); Yuji Ohashi, Sendai (JP); Yuui Yokota, Sendai (JP); Kei Kamada, Sendai (JP); Shunsuke Kurosawa, Sendai (JP)

(73) Assignees: PIEZO STUDIO INC., Miyagi (JP); TOHOKU UNIVERSITY, Miyagi (JP)

( * ) Notice: Subject to any disclaimer, the term of this patent is extended or adjusted under 35 U.S.C. 154(b) by 263 days.

(21) Appl. No.: 15/750,821

(22) PCT Filed: Jul. 25, 2016

(86) PCT No.: PCT/JP2016/071718
§ 371 (c)(1),
(2) Date: Feb. 6, 2018

(87) PCT Pub. No.: WO2017/026257
PCT Pub. Date: Feb. 16, 2017

(65) Prior Publication Data
US 2018/0226939 A1    Aug. 9, 2018

(30) Foreign Application Priority Data

Aug. 7, 2015   (JP) .................................. 2015-156979
Aug. 7, 2015   (JP) .................................. 2015-156982

(51) Int. Cl.
*H03H 3/04*     (2006.01)
*H03H 3/02*     (2006.01)
(Continued)

(52) U.S. Cl.
CPC ............... *H03H 3/04* (2013.01); *H01L 41/29* (2013.01); *H01L 41/337* (2013.01); *H03H 3/02* (2013.01);
(Continued)

(58) Field of Classification Search
CPC .................. H01L 41/337; H01L 41/29; H03H 2003/0435; H03H 2003/025; H03H 9/175; H03H 9/131
See application file for complete search history.

(56) References Cited

U.S. PATENT DOCUMENTS

2003/0199105 A1*  10/2003  Kub ................... H01L 21/76254
                                                                          438/3
2008/0169728 A1    7/2008  Asai et al.
(Continued)

FOREIGN PATENT DOCUMENTS

JP    2003-505906 A    2/2003
JP    2007-243451 A    9/2007
(Continued)

OTHER PUBLICATIONS

International Search Report and Written Opinion received for PCT Patent Application No. PCT/JP2016/071718, dated Oct. 11, 2016, 11 pages (6 pages of English Translation and 5 pages of Original Document).

(Continued)

*Primary Examiner* — Livius R. Cazan
(74) *Attorney, Agent, or Firm* — Womble Bond Dickinson (US) LLP (57) ABSTRACT

To improve the Q value of a piezoelectric thin-film element in a state in which unnecessary vibration is suppressed, an acoustic reflection film (104) is affixed to a first electrode (102), a piezoelectric single-crystal substrate (101) is thinned by polishing from the other surface (101*b*) of the (Continued)

piezoelectric single-crystal substrate (101), such that the first electrode (102) and piezoelectric thin film (105) are piled on the piezoelectric single-crystal substrate (101). In this polishing, a pressure (polishing pressure) to the surface (101*b*) during polishing in an electrode formation region where the first electrode (102) is formed differs from that in a non-electrode formation region around the electrode formation region. Consequently, the electrode formation region of the piezoelectric thin film (105), where the first electrode (102) is formed, is made thinner than the non-electrode formation region around the electrode formation region.

3 Claims, 4 Drawing Sheets (51) Int. Cl.
*H01L 41/337* (2013.01)
*H03H 9/13* (2006.01)
*H03H 9/17* (2006.01)
*H01L 41/29* (2013.01)
*H03H 9/05* (2006.01)
*H03H 9/56* (2006.01)

(52) U.S. Cl.
CPC ............ *H03H 9/131* (2013.01); *H03H 9/175* (2013.01); *H03H 9/0561* (2013.01); *H03H 9/564* (2013.01); *H03H 2003/025* (2013.01); *H03H 2003/0435* (2013.01); *H03H 2003/0457* (2013.01)

(56) References Cited

U.S. PATENT DOCUMENTS

| | | | |
|---|---|---|---|
| 2010/0013573 | A1 | 1/2010 | Umeda |
| 2010/0231329 | A1* | 9/2010 | Barber ................ H03H 3/02 |
| | | | 333/187 |

FOREIGN PATENT DOCUMENTS

| | | | |
|---|---|---|---|
| JP | 2008-172713 A | | 7/2008 |
| JP | 2008-172723 A | | 7/2008 |
| JP | 2009-232283 A | | 10/2009 |
| JP | 2009-290374 A | | 12/2009 |
| JP | WO2017026257 A1 | | 5/2018 |
| WO | WO 01/06647 A1 | | 1/2001 |
| WO | WO 2008/126473 A1 | | 10/2008 |

OTHER PUBLICATIONS

International Preliminary Report on Patentability received for PCT Patent Application No. PCT/JP2016/071718, dated Feb. 22, 2018, 10 pages (6 pages of English Translation and 4 pages of Original Document).

Office Action received for Japanese Patent Application No. 2019-137716, dated Jun. 16, 2020, 7 pages (4 pages of English Translation and 3 pages of Office Action).

* cited by examiner

METHOD FOR MANUFACTURING PIEZOELECTRIC THIN-FILM ELEMENT

TECHNICAL FIELD

The present invention relates to a method of manufacturing a piezoelectric thin-film element including a piezoelectric thin film formed on an acoustic reflection film.

BACKGROUND ART

In a communication apparatus such as a cell phone, a piezoelectric thin-film filter using a piezoelectric thin-film resonator is beginning to be used as a bandpass filter for selectively transmitting or receiving only a desired signal. For example, an FBAR (Thin Film Bulk Acoustic Resonator) filter is known as the piezoelectric thin-film filter. In this filter, a piezoelectric thin film sandwiched between electrodes is formed on a substrate such as an Si substrate, and a gap is formed on the substrate side of the electrode formation portion in order to prevent a leak of vibration energy to the Si substrate. An SMR (Solidity Mounted Resonator) filter using an acoustic reflection film instead of a gap is also used. These filters are generically called BAW (Bulk Acoustic Wave) filters.

The operation principle of the BAW filter will briefly be explained below. When a high-frequency signal is applied between two electrodes sandwiching a piezoelectric thin film, the piezoelectric thin film resonates at a frequency corresponding to the piezoelectric thin film, thereby functioning as a resonator. When a ladder circuit is formed by connecting an interconnection to each electrode of this piezoelectric thin-film resonator, a desired filter characteristic can be obtained.

Since the BAW filter is a filter using a piezoelectric thin-film resonator, it is necessary to sufficiently increase the Q value as a quality coefficient of the piezoelectric thin-film resonator. To improve the Q value of the resonator, it is ideal to completely confine vibration energy generated by resonance in the piezoelectric thin film. In an actual piezoelectric thin-film resonator, however, the vibration energy leaks due to a propagation mode in a lateral direction perpendicular to the thickness direction, and generates unnecessary vibration (spurious).

To solve this problem, patent literature 1 suppresses the spurious caused by the lateral propagation mode by increasing the thickness of one electrode (apex electrode) in the vicinity of the edge. Also, patent literature 2 suppresses the spurious caused by the lateral propagation mode by decreasing the thickness of the piezoelectric thin film in an excitation region, and increasing the thickness in a non-excitation region in the periphery. Furthermore, patent literature 2 has a structure in which a cave is formed in a support substrate in the excitation region where the piezoelectric thin film is thinned, so vibration excited in the excitation region does not interfere with the support substrate.

In addition, in the technique of patent literature 2, a single-crystal substrate having a thickness with which the substrate can withstand its own weight is adhered to the support substrate having the gap, and thinned to a desired thickness by mechanical polishing or the like, thereby obtaining a predetermined frequency. In the technique of patent literature 2, therefore, a piezoelectric thin film is formed without film formation such as deposition, and this eliminates a problem such as the influence of the underlayer on the crystallinity. Consequently, it can be expected to obtain a good piezoelectric performance.

RELATED ART LITERATURE

Patent Literature

Patent Literature 1: Japanese PCT National Publication No. 2003-505906
Patent Literature 2: Japanese Patent Laid-Open No. 2007-243451
Patent Literature 3: Japanese Patent Laid-Open No. 2009-290374

DISCLOSURE OF INVENTION

Problem to be Solved by the Invention

Unfortunately, the above-described techniques have the following problems. First, the technique described in patent literature 1 has the effect of suppressing the spurious in the piezoelectric layer, but the electrode thickness is changed in the vibrating portion, and this may generate vibration different from main vibration. This poses the problem that another spurious is generated.

Also, in the technique described in patent literature 2, a cave is formed in the support substrate in the excitation region where the piezoelectric thin film is thinned. Therefore, if the region where the piezoelectric thin film is thinned and the caved portion of the support substrate are not accurately aligned but misaligned, a new spurious may occur. Furthermore, in the technique of patent literature 2, when the piezoelectric thin film is further thinned as the frequency to be used as a filter rises, the piezoelectric thin film becomes difficult to support. Consequently, frequency variations may be increased by, e.g., the warpage of the piezoelectric thin film in the excitation region.

The present invention has been made to solve the problems as described above, and has as its object to improve the Q value of a piezoelectric thin-film element in a state in which unnecessary vibration is suppressed.

Means of Solution to the Problem

A method of manufacturing a piezoelectric thin-film element according to the present invention includes a first step of forming, on one surface of a piezoelectric single-crystal substrate made of a single crystal of a piezoelectric material, a first electrode in a predetermined planar shape with an area smaller than that of the piezoelectric single-crystal substrate, a second step of affixing, to the first electrode, a multilayered acoustic film consisting of a plurality of layers different in acoustic impedance which are alternately piled, a third step of thinning the piezoelectric single-crystal substrate by polishing the piezoelectric single-crystal substrate from the other surface, such that the first electrode and a piezoelectric thin film obtained by thinning the piezoelectric single-crystal substrate are piled on the multilayered acoustic film, and a fourth step of forming, on the piezoelectric thin film, a second electrode that faces the first electrode with the piezoelectric thin film in between and has an area smaller than that of the first electrode, wherein in the third step, an electrode formation region of the piezoelectric thin film, where the first electrode is formed, is made thinner than a non-electrode formation region around the electrode formation region, where the first electrode is not formed, by a polishing pressure difference between the electrode formation region and the non-electrode formation region.

In the method of manufacturing a piezoelectric thin-film element described above, in the first step, a dummy electrode that is irrelevant to vibration of the piezoelectric thin film can be formed around the first electrode on one surface of the piezoelectric single-crystal substrate such that the dummy electrode is isolated from the first electrode, wherein the electrode formation region includes a region where the first electrode and the dummy electrode are formed.

Also, a method of manufacturing a piezoelectric thin-film element according to the present invention includes a first step of forming, on one surface of a piezoelectric single-crystal substrate made of a single crystal of a piezoelectric material, a first electrode in a predetermined planar shape with an area smaller than that of the piezoelectric single-crystal substrate, a second step of forming a second electrode that has an area different from that of the first electrode on one surface of a multilayered acoustic film consisting of a plurality of layers different in acoustic impedance which are alternately piled, a third step of affixing the first electrode and the second electrode to each other, a fourth step of thinning the piezoelectric single-crystal substrate, such that the second electrode, the first electrode, and a piezoelectric thin film obtained by thinning the piezoelectric single-crystal substrate are piled on the multilayered acoustic film, and a fifth step of forming, on the piezoelectric thin film, a third electrode that faces the first electrode with the piezoelectric thin film in between and has an area larger than that of the first electrode.

In the method of manufacturing a piezoelectric thin-film element described above, in the fourth step, the piezoelectric thin film is obtained by thinning the piezoelectric single-crystal substrate from the other surface of the piezoelectric single-crystal substrate by polishing, and an electrode formation region where the first electrode is formed is preferably made thinner than a non-electrode formation region around the electrode formation region, where the first electrode is not formed, by a polishing pressure difference between the electrode formation region and the non-electrode formation region.

Effect of the Invention

According to the present invention as explained above, it is possible to obtain an excellent effect of improving the Q value of a piezoelectric thin-film element in a state in which unnecessary vibration is suppressed.

BEST MODE FOR CARRYING OUT THE INVENTION

Embodiments of the present invention will be explained below with reference to accompanying drawings.

First Embodiment

First, the first embodiment of the present invention will be explained below with reference to FIGS. 1A to 1F. FIGS. 1A to 1F are sectional views showing the states of individual steps for explaining a method of manufacturing a piezoelectric thin-film element (piezoelectric resonator) according to the first embodiment of the present invention.

Figure 1A:
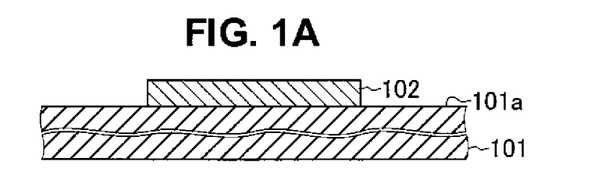
FIG. 1A is a sectional view showing the state of a step for explaining a method of manufacturing a piezoelectric thin-film element according to the first embodiment of the present invention.

First, as shown in FIG. 1A, a first electrode 102 in a predetermined planar shape whose area is smaller than that of a designed element region of a piezoelectric single-crystal substrate 101 made of a single crystal of a piezoelectric material is formed on one surface 101a of the piezoelectric single-crystal substrate 101 (a first step). For example, a plurality of element regions each functioning as a piezoelectric resonator are set on the piezoelectric single-crystal substrate 101, and the first electrode 102 is formed in each element region. It is also possible to set one element region on the piezoelectric single-crystal substrate 101. A central portion of the element region in a planar view and a central portion of the first electrode 102 in a planar view practically overlap each other. Note that FIGS. 1A to 1F show one element region.

The piezoelectric single-crystal substrate 101 is, e.g., an AlN single-crystal substrate formed by using a sublimation method, has a c-plane as a main surface, and has a thickness of about 250 µm. Also, the first electrode 102 is made of a metal such as Pt, Mo, or W. For example, the first electrode 102 can be formed by forming a metal film by depositing Mo by a well-known RF magnetron sputtering method, forming a resist pattern on this metal film by a well-known photolithography technique, etching the metal film by ion milling by using the formed resist pattern as a mask, and removing the resist pattern after that. The resist pattern can be formed by performing alignment based on alignment marks preformed on the piezoelectric single-crystal substrate 101.

Figure 1B:
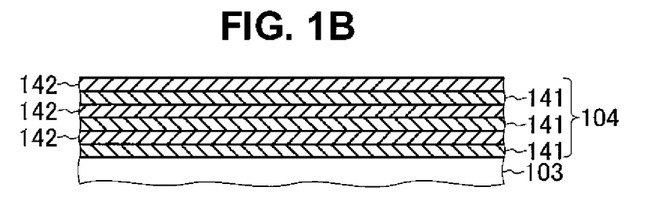
FIG. 1B is a sectional view showing the state of a step for explaining the method of manufacturing a piezoelectric thin-film element according to the first embodiment of the present invention.

Then, as shown in FIG. 1B, an acoustic reflection film 104 is formed on a support substrate 103 by alternately piling a plurality of layers different in acoustic impedance. In the acoustic reflection film 104, adjacent layers have different acoustic impedances, and layers having the same acoustic impedance are alternately piled. The support substrate 103 is made of, e.g., Si(111), and has a thickness of 250 µm. The support substrate 103 made of Si(111) desirably has a high resistance, and preferably has, e.g., a specific resistance of 1,000 Ω/cm or more.

The acoustic reflection film 104 is formed by alternately stacking three pairs of high-acoustic-impendence layers 141 and low-acoustic-impedance layers 142 different in acoustic impedance. Only two to four pairs of the high-acoustic-impedance layers 141 and low-acoustic-impedance layers 142 need to be piled. The high-acoustic-impedance layer 141 has an acoustic impedance higher than that of the low-acoustic-impedance layer 142. For example, the high-acoustic-impedance layer 141 is made of AlN and has a thickness of 1.4 µm. Also, the low-acoustic-impedance layer 142 is made of $SiO_2$ and has a thickness of 0.7 µm. These layers can be formed by, e.g., RF magnetron sputtering.

The high-acoustic-impedance layer 141 having a higher acoustic impedance can also be made of, e.g., ZnO, W, Mo, Cu, or $Al_2O_3$, instead of AlN. Likewise, the low-acoustic-impedance layer 142 having a lower acoustic impedance can also be made of, e.g., Mg or Al, instead of $SiO_2$. Note that the total thickness of the acoustic reflection film 104 is ¼ the wavelength at which a sound wave (bulk wave) having a resonance frequency when a piezoelectric thin film 105 (to be described later) is in an independent state propagates through the acoustic reflection film 104 in an independent state.

Figure 1C:
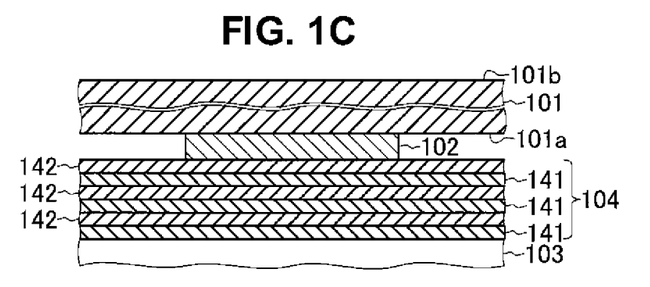
FIG. 1C is a sectional view showing the state of a step for explaining the method of manufacturing a piezoelectric thin-film element according to the first embodiment of the present invention.

Subsequently, the acoustic reflection film 104 is affixed to the first electrode 102 as shown in FIG. 1C (a second step). For example, an affixing surface of the acoustic reflection film 104 (the surface of the uppermost low-acoustic-impedance layer 142) and the surface of the first electrode 102 can be affixed by atomic diffusion bonding or anodic bonding.

Figure 1D:
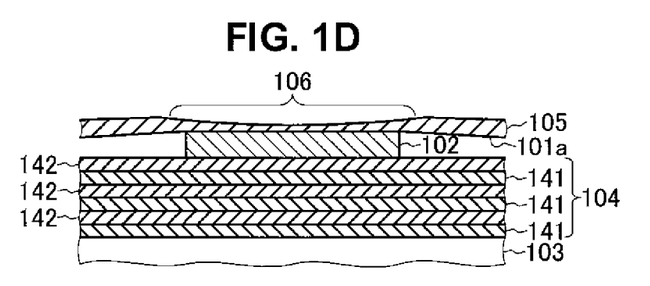
FIG. 1D is a sectional view showing the state of a step for explaining the method of manufacturing a piezoelectric thin-film element according to the first embodiment of the present invention.

Then, as shown in FIG. 1D, the piezoelectric single-crystal substrate 101 is thinned by polishing from the other surface 101b of the piezoelectric single-crystal substrate 101, thereby obtaining a state in which the first electrode 102 and piezoelectric thin film 105 are piled on the acoustic reflection film 104 (a third step). The piezoelectric thin film 105 is obtained by thinning the piezoelectric single-crystal substrate 101. In this step, an electrode formation region (vibrating portion) of the piezoelectric thin film 105, where the first electrode 102 is formed, is made thinner than a non-electrode formation region (non-vibrating portion) around the electrode formation region, where the first electrode 102 is not formed. For example, the thickness of the piezoelectric thin film 105 in the electrode formation region where the first electrode 102 is formed can be set to about 2.8 µm. Note that the thickness of the electrode formation region of the piezoelectric thin film 105, where the first electrode 102 is formed, can be half or ¼ a wavelength λ at which a sound wave having the resonance frequency of the piezoelectric thin film 105 in an independent state propagates through the piezoelectric thin film 105 in an independent state.

A hard polishing pad can be used when polishing the piezoelectric single-crystal substrate 101. In this polishing, the first electrode 102 is partially formed on the surface 101a as a reverse surface to the surface 101b as a surface to be polished, and a gap exists between the acoustic reflection film 104 and surface 101a in the non-electrode formation region around the first electrode 102. Consequently, a pressure (polishing pressure) to the surface 101b during polishing in the electrode formation region where the first electrode 102 is formed differs from that in the non-electrode formation region around the electrode formation region.

In the electrode formation region where the first electrode 102 is formed, the polishing pressure is higher than that in the non-electrode formation region around the electrode formation region, so the polishing rate increases. On the other hand, the polishing pressure is low in the non-electrode formation region around the first electrode 102, so the polishing rate decreases. This polishing rate difference forms a planar recess 106 having the same center as that of the first electrode 102 in a planar view, in the electrode formation region of the piezoelectric thin film 105. As a consequence, the electrode formation region of the piezoelectric thin film 105, where the first electrode 102 is formed, is made thinner than the non-electrode formation region around the electrode formation region.

Figure 1E:
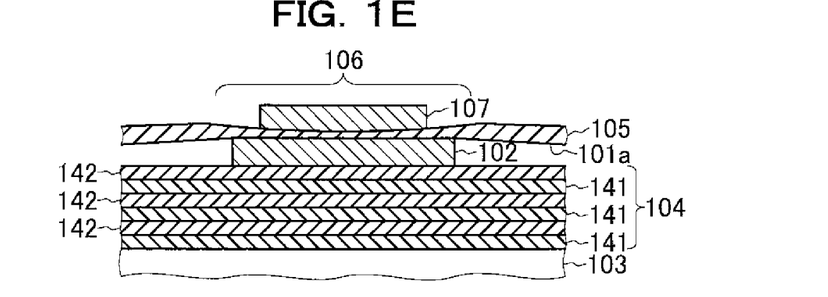
FIG. 1E is a sectional view showing the state of a step for explaining the method of manufacturing a piezoelectric thin-film element according to the first embodiment of the present invention.

Subsequently, as shown in FIG. 1E, a second electrode 107 that faces the first electrode 102 with the piezoelectric thin film 105 in between and has an area smaller than that of the first electrode 102 is formed on the piezoelectric thin film 105 (a fourth step). The second electrode 107 need only be arranged such that the central portions of the first electrode 102 and second electrode 107 overlap each other in a planar view. The second electrode 107 is arranged inside the formation region of the first electrode 102 in a planar view.

The second electrode 107 is made of a metal such as Pt, Mo, or W. For example, the second electrode 107 can be formed by forming a metal film by depositing Mo by a well-known magnetron sputtering method, forming a resist pattern on this metal film by a well-known photolithography technique, etching the metal film by ion milling by using the formed resist pattern as a mask, and removing the resist pattern after that. The second electrode 107 may also be formed by a well-known lift-off method. In either case, the resist pattern (lift-off pattern) can be formed by performing alignment based on the alignment marks formed on the piezoelectric single-crystal substrate 101 and remaining even in the state of the piezoelectric thin film 105.

Note that although not shown, an SMR filter is formed by electrically connecting a plurality of elements (piezoelectric resonators) each having a pair of the first electrode 102 and second electrode 107 by a predetermined connection, and each SMR filter is cut out from the support substrate 103. Also, some piezoelectric resonators forming the SMR filter must have different resonance frequencies. In this case, weight electrodes are further formed on the second electrodes 107 of the corresponding piezoelectric resonators, and the frequencies of the corresponding piezoelectric resonators are set. It is also possible to obtain a plurality of elements by cutting them out from individual element regions.

In the above-described piezoelectric thin-film element, the portion where the first electrode 102 and second electrode 107 overlap each other in a planar view is a region to which an electric field is effectively applied. When an AC voltage is applied between the first electrode 102 and second electrode 107, resonance occurs at a frequency as the resonance frequency.

A bulk wave generated by this resonance and having propagated to the second electrode 107 is generally reflected by the end face of the second electrode 107, and a bulk wave having propagated to the first electrode 102 propagates to the acoustic reflection film 104. The thickness of the acoustic reflection film 104 is set to ¼ the wavelength at which a bulk wave having the resonance frequency propagates through the acoustic reflection film 104 in an independent state. Accordingly, the phases of reflected waves from the boundary surfaces between the high-acoustic-impedance layers 141 and low-acoustic-impedance layers 142 overlap each other. This effectively eliminates the influence of the support substrate 103.

The bulk wave excited by the piezoelectric thin film 105 propagates in the planar direction (lateral direction) of the piezoelectric thin film 105 as well. In the piezoelectric thin-film element according to the first embodiment described above, however, the thickness of the piezoelectric thin film 105 in the vibrating portion (electrode formation region) below the second electrode 107 is made smaller than that of the piezoelectric thin film 105 in the non-vibrating portion (non-electrode formation region) outside the second electrode 107 in a planar view. Therefore, no unnecessary spurious occurs because the vibration energy is confined in the vibrating portion.

Figure 1F:
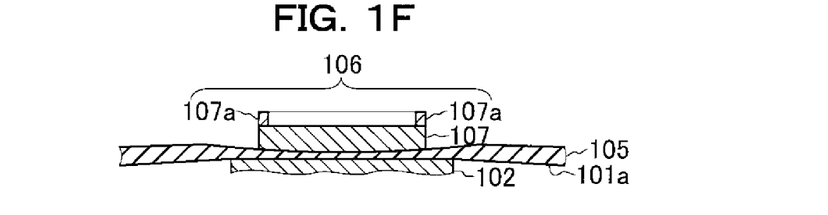
FIG. 1F is a sectional view showing the state of a step for explaining the method of manufacturing a piezoelectric thin-film element according to the first embodiment of the present invention.

Furthermore, as shown in FIG. 1F, an auxiliary electrode 107a may also be formed on the second electrode 107. The auxiliary electrode 107a can be formed in the periphery or in a region close to the periphery of the upper surface of the second electrode 107. Also, the auxiliary electrode 107a need only be formed into a planar shape corresponding to the periphery of the second electrode 107. When the auxiliary electrode 107a is formed on the second electrode 107, it is possible to further confine the vibration energy in the vibrating portion and further suppress the occurrence of unnecessary spurious. The above effect can be obtained more by making the auxiliary electrode 107a as thick as possible. The formation portion and thickness of the auxiliary electrode 107a can appropriately be set in accordance with the occurrence frequency of spurious.

Note that when the vibration energy is confined below the second electrode 107, multiple reflection in the second electrode 107 generates spurious. To suppress this, the planar shape of the second electrode 107 can be formed into the shape of an ellipse or the shape of a polygon having no parallel opposing sides.

When forming the first electrode 102, it is also possible to appropriately form and arrange a dummy electrode that is irrelevant to the vibration of the piezoelectric thin film 105 around the first electrode 102 on one surface of the piezoelectric single-crystal substrate 101 such that the dummy electrode is isolated from the first electrode 102, and use the region where the first electrode 102 and dummy electrode are formed as an electrode formation region. By adjusting the stress to be applied to the piezoelectric single-crystal substrate 101 during polishing by the position of this dummy electrode, it is possible to adjust the ratio of the thickness of the vibrating portion to that of the non-vibrating portion in the piezoelectric thin film 105. Properly forming the dummy electrode around the first electrode 102 makes it possible to reduce variations in polishing rate caused by the coarseness/fineness of a pattern, and appropriately set the thicknesses of the vibrating portion and non-vibrating portion in the piezoelectric thin film 105.

In the first embodiment as explained above, the first electrode in a predetermined planar shape with an area smaller than that of a piezoelectric single-crystal substrate made of a single crystal of a piezoelectric material is formed on one surface of the piezoelectric single-crystal substrate, and the thickness of the piezoelectric thin film sandwiched between two electrodes is decreased by producing a polishing pressure difference during polishing of the piezoelectric single-crystal substrate, thereby suppressing spurious caused by a lateral propagation mode. This makes it possible to improve the Q value of the piezoelectric thin-film element in a state in which unnecessary vibration is suppressed.

Also, in the first embodiment, various piezoelectric materials can be selected as the piezoelectric thin film because the piezoelectric thin film is formed without film formation such as deposition. For example, it is possible to use, e.g., ZnO, $LiTaO_3$, $LiNbO_3$, crystal, or $KNbO_3$, instead of AlN described above, as the piezoelectric thin film (piezoelectric single-crystal substrate). Furthermore, a piezoelectric single-crystal substrate having an arbitrary crystal orientation can be selected as the piezoelectric thin film. This increases the degree of freedom of filter design.

Since the BAW filter is a filter using a piezoelectric thin-film resonator, it is necessary to sufficiently increase the Q value as a quality coefficient of the piezoelectric thin-film resonator. To improve the Q value of the resonator, the crystallinity of a piezoelectric thin film is important. For example, when forming a piezoelectric thin film on one electrode and forming another electrode on the formed piezoelectric thin film, it is important to form the piezoelectric thin film on one electrode with high orientation. In this case, the crystallinity of the piezoelectric thin film formation surface of one electrode influences the orientation of the piezoelectric thin film. Also, in an SMR filter using an acoustic reflection film, the crystallinity of a support substrate or the acoustic reflection film influences the orientation (crystallinity) of a finally obtained piezoelectric thin film, and influences the performance of an element.

To solve the above problems, there is a technique by which a KNN fragment is cut out from a bulk of a piezoelectric material, the cutout KNN fragment is bonded to a lower electrode formed on a multilayered acoustic film, a piezoelectric-material portion is formed by patterning the bonded KNN fragment, and an upper electrode is formed on this piezoelectric-material portion, thereby obtaining a BAW resonator having a high Q value (see patent literature 3). In this technique, a high bonding strength is obtained between the KNN fragment and lower electrode by bonding a bonding metal layer formed on the KNN fragment and an upper metal layer of the lower electrode. In addition, the piezoelectric-material portion having an area smaller than that of the lower electrode is formed by patterning the KNN fragment, thereby confining vibration energy generated by resonance in the piezoelectric-material portion.

In the above-described technique, however, the piezoelectric-material portion has a small area, so an insulating layer is buried around the piezoelectric-material portion in order to form the upper electrode and form an interconnection to the upper electrode. Since the insulating layer is formed around the vibrating portion as described above, a lateral vibration leak occurs, and the Q value decreases.

A method of manufacturing a piezoelectric thin-film element, by which, in order to eliminate the above-described problem, a piezoelectric thin film and acoustic reflection film having a high crystallinity can be integrated with high strength in a state in which a lateral vibration leak is suppressed, will be explained below by using the second embodiment.

Second Embodiment

The second embodiment of the present invention will be explained below with reference to FIGS. 2A to 2F. FIGS. 2A to 2F are sectional views showing the states of individual steps for explaining a method of manufacturing a piezoelectric thin-film element (piezoelectric resonator) according to the second embodiment of the present invention.

Figure 2A:
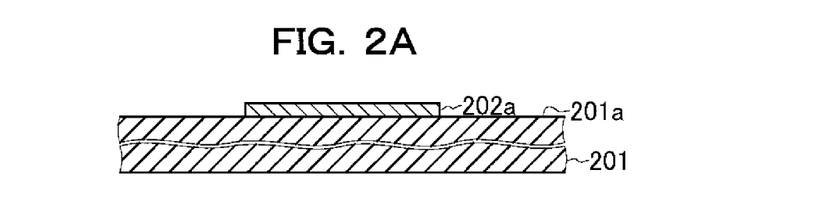
FIG. 2A is a sectional view showing the state of a step for explaining a method of manufacturing a piezoelectric thin-film element according to the second embodiment of the present invention.

First, as shown in FIG. 2A, a first electrode 202a in a predetermined planar shape with an area smaller than a designed element region of a piezoelectric single-crystal substrate 201 made of a single crystal of a piezoelectric material is formed on one surface 201a of the piezoelectric single-crystal substrate 201 (a first step). For example, a plurality of element regions each functioning as a piezoelectric resonator are set on the piezoelectric single-crystal substrate 201, and the first electrode 202a is formed in each element region. One element region may also be set on the piezoelectric single-crystal substrate 201. A central portion of the element region in a planar view and a central portion of the first electrode 202a in a planar view practically overlap each other. Note that FIGS. 2A to 2F show one element region.

The piezoelectric single-crystal substrate 201 is, e.g., an AlN single-crystal substrate formed by using a sublimation method, has a c-plane as a main surface, and has a thickness of about 250 µm. Also, the first electrode 202a is made of a metal such as Pt, Mo, or W. For example, the first electrode 202a can be formed by forming a metal film by depositing Mo by a well-known RF magnetron sputtering method, forming a resist pattern on this metal film by a well-known photolithography technique, etching the metal film by ion milling by using the formed resist pattern as a mask, and removing the resist pattern after that. The resist pattern can be formed by performing alignment based on alignment marks preformed on the piezoelectric single-crystal substrate 201.

Figure 2B:
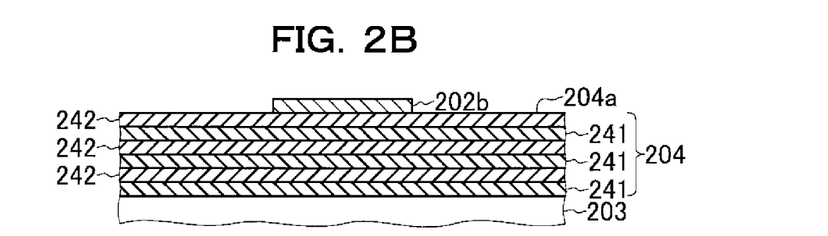
FIG. 2B is a sectional view showing the state of a step for explaining the method of manufacturing a piezoelectric thin-film element according to the second embodiment of the present invention.

Then, as shown in FIG. 2B, an acoustic reflection film 204 is formed on a support substrate 203 by alternately piling a plurality of layers different in acoustic impedance, and a second electrode 202b is formed on one surface 204a of the acoustic reflection film 204 (a second step). The surface 204a is a surface on the affixing side. In the acoustic reflection film 204, adjacent layers have different acoustic impedances, and layers having the same acoustic impedance are alternately piled. The second electrode 202b is formed to have an area different from that of the first electrode 202a. For example, the second electrode 202b is formed to have an area smaller than that of the first electrode 202a. Note that the first electrode 202a may also be formed to have an area smaller than that of the second electrode 202b. In addition, the second electrode 202b is made thinner than the first electrode 202a.

The support substrate 203 is made of, e.g., Si(111), and has a thickness of 250 µm. The support substrate 203 made of Si(111) desirably has a high resistance, and preferably has, e.g., a specific resistance of 1,000 Ω/cm or more.

The acoustic reflection film 204 is formed by alternately stacking three pairs of high-acoustic-impendence layers 241 and low-acoustic-impedance layers 242 different in acoustic impedance. Only two to four pairs of the high-acoustic-impedance layers 241 and low-acoustic-impedance layers 242 need to be piled. The high-acoustic-impedance layer 241 has an acoustic impedance higher than that of the low-acoustic-impedance layer 242. For example, the high-acoustic-impedance layer 241 is made of AlN and has a thickness of 1.4 µm. Also, the low-acoustic-impedance layer 242 is made of $SiO_2$ and has a thickness of 0.7 µm. These layers can be formed by, e.g., RF magnetron sputtering.

The high-acoustic-impedance layer 241 having a higher acoustic impedance can also be made of, e.g., ZnO, W, Mo, Cu, or $Al_2O_3$, instead of AlN. Likewise, the low-acoustic-impedance layer 242 having a lower acoustic impedance can also be made of, e.g., Mg or Al, instead of $SiO_2$. Note that the total thickness of the acoustic reflection film 204 is ¼ the wavelength at which a sound wave (bulk wave) having a resonance frequency when a piezoelectric thin film 205 (to be described later) in an independent state propagates through the acoustic reflection film 204 in an independent state.

The second electrode 202b is made of a metal such as Pt, Mo, or W. For example, the second electrode 202b can be formed by forming a metal film by depositing Mo by a well-known RF magnetron sputtering method, forming a resist pattern on this metal film by a well-known photolithography technique, etching the metal film by ion milling by using the formed resist pattern as a mask, and removing the resist pattern after that. The resist pattern can be formed by performing alignment based on alignment marks preformed on the support substrate 203.

Figure 2C:
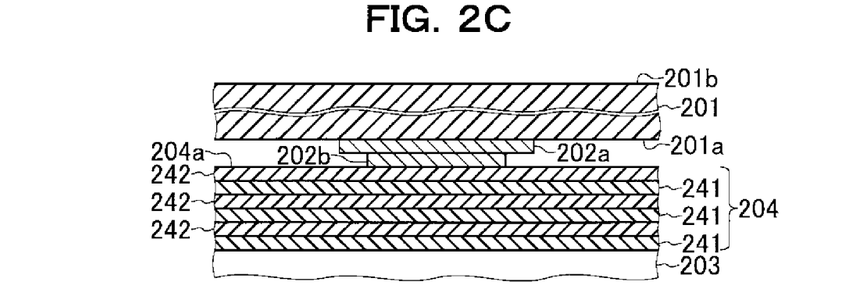
FIG. 2C is a sectional view showing the state of a step for explaining the method of manufacturing a piezoelectric thin-film element according to the second embodiment of the present invention.

Subsequently, the first electrode 202a and second electrode 202b are affixed as shown in FIG. 2C (a third step). This lamination (bonding) is performed such that a central portion (center) of the first electrode 202a and a central portion of the second electrode 202b are so aligned as to overlap each other in a planar view. In the second embodiment, the area of the second electrode 202b is smaller than that of the first electrode 202a, so the second electrode 202b is positioned inside the formation area of the first electrode 202a in a planar view. A high bonding strength can be obtained by thus bonding metals. In addition, the first electrode 202a and second electrode 202b are integrated by bonding, and function as one electrode forming a resonator using the piezoelectric thin film 205 (to be described later).

For example, the first electrode 202a and second electrode 202b are aligned as described above and abutted against each other, heated to about 200° C. to 300° C. in this state, and bonded by applying a pressure between them. These electrodes may also be bonded by surface activation bonding or atomic diffusion bonding. Furthermore, these electrodes can be bonded by eutectic bonding.

Figure 2D:
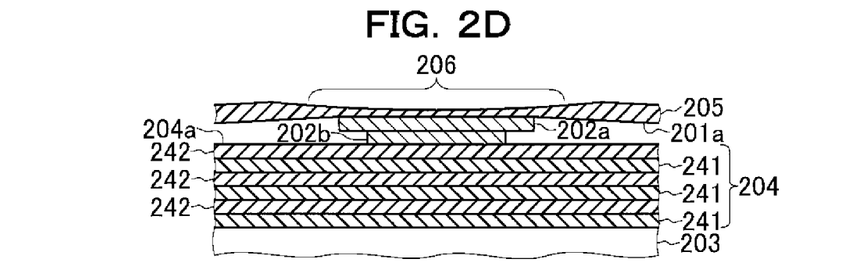
FIG. 2D is a sectional view showing the state of a step for explaining the method of manufacturing a piezoelectric thin-film element according to the second embodiment of the present invention.

Then, as shown in FIG. 2D, the piezoelectric single-crystal substrate 201 is thinned from the other surface 201b of the piezoelectric single-crystal substrate 201, thereby obtaining a state in which the piezoelectric thin film 205 obtained by thinning the second electrode 202b, first electrode 202a, and piezoelectric single-crystal substrate 201 is piled on the acoustic reflection film 204 (a fourth step). For example, the thickness of the piezoelectric thin film 205 in an electrode formation region where the first electrode 202a is formed can be set to about 2.8 µm. The piezoelectric thin film 205 is obtained by thus affixing and thinning the piezoelectric single-crystal substrate 201 having a high crystallinity, so the piezoelectric thin film 205 also has a high crystallinity.

This thinning is preferably performed by polishing. When thinning is performed by polishing, an electrode formation region (vibrating portion) of the piezoelectric thin film 205, where the first electrode 202a is formed, becomes thinner than a non-electrode formation region (non-vibrating portion) around the electrode formation region, where the first electrode 202a is not formed. Note that the thickness of the electrode formation region of the piezoelectric thin film 205, where the first electrode 202a is formed, can be half or ¼ a wavelength λ at which a sound wave having the resonance frequency of the piezoelectric thin film 205 in an independent state propagates through the piezoelectric thin film 205 in an independent state.

A hard polishing pad can be used when polishing the piezoelectric single-crystal substrate 201 in the above-described thinning. In this polishing, the first electrode 202a is partially formed on the surface 201a as a reverse surface to the surface 201b as a surface to be polished, and a gap exists between the acoustic reflection film 204 and surface 201a in the non-electrode formation region around the first electrode 202a. Consequently, a pressure (polishing pressure) to the surface 201b during polishing in the electrode formation region where the first electrode 202a differs from that in the non-electrode formation region around the electrode formation region.

In the electrode formation region where the first electrode 202a is formed, the polishing pressure is higher than that in the non-electrode formation region around the electrode formation region, so the polishing rate increases. On the other hand, the polishing pressure is low in the non-electrode formation region around the first electrode 202a, so the polishing rate decreases. This polishing rate difference forms a planar recess 206 having the same center as that of the first electrode 202a in a planar view, in the electrode formation region of the piezoelectric thin film 205. As a consequence, the electrode formation region of the piezoelectric thin film 205, where the first electrode 202a is formed, is made thinner than the non-electrode formation region around the electrode formation region.

Figure 2E:
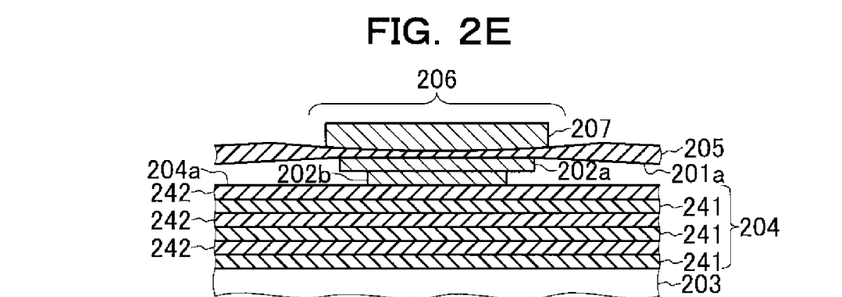
FIG. 2E is a sectional view showing the state of a step for explaining the method of manufacturing a piezoelectric thin-film element according to the second embodiment of the present invention.

Subsequently, as shown in FIG. 2E, a third electrode 207 that faces the first electrode 202a with the piezoelectric thin film 205 in between and has an area larger than that of the first electrode 202a is formed on the piezoelectric thin film 205 (a fifth step). The third electrode 207 functions as the other electrode forming the resonator using the piezoelectric thin film 205. The third electrode 207 need only be arranged such that the central portions of the first electrode 202a (the second electrode 202b) and third electrode 207 overlap each other in a planar view. The first electrode 202a is arranged inside the formation region of the third electrode 207 in a planar view.

The third electrode 207 is made of a metal such as Pt, Mo, or W. For example, the third electrode 207 can be formed by forming a metal film by depositing Mo by a well-known magnetron sputtering method, forming a resist pattern on this metal film by a well-known photolithography technique, etching the metal film by ion milling by using the formed resist pattern as a mask, and removing the resist pattern after that. The third electrode 207 may also be formed by a well-known lift-off method. In either case, the resist pattern (lift-off pattern) can be formed by performing alignment based on the alignment marks formed on the piezoelectric single-crystal substrate 201 and remaining even in the state of the piezoelectric thin film 205.

Note that although not shown, an SMR filter is formed by electrically connecting a plurality of elements (piezoelectric resonators) each having a set of the second electrode 202b, first electrode 202a, and third electrode 207 by a predetermined connection, and each SMR filter is cut out from the support substrate 203. Also, some piezoelectric resonators forming the SMR filter must have different resonance frequencies. In this case, weight electrodes are further formed on the third electrodes 207 of the corresponding piezoelectric resonators, and the frequencies of the corresponding piezoelectric resonators are set. It is also possible to obtain a plurality of elements by cutting them out from individual element regions.

In the above-described piezoelectric thin-film element, the portion where the first electrode 202a and third electrode 207 overlap each other in a planar view is a region to which an electric field is effectively applied. When an AC voltage is applied between the first electrode 202a and third electrode 207, resonance occurs at a frequency as the resonance frequency.

A bulk wave generated by this resonance and having propagated to the third electrode 207 is generally reflected by the end face of the third electrode 207, and a bulk wave having propagated to the first electrode 202a propagates to the acoustic reflection film 204. The thickness of the acoustic reflection film 204 is set to ¼ the wavelength at which a bulk wave having the resonance frequency propagates through the acoustic reflection film 204 in an independent state. Accordingly, the phases of reflected waves from the boundary surfaces between the high-acoustic-impedance layers 241 and low-acoustic-impedance layers 242 overlap each other. This effectively eliminates the influence of the support substrate 203.

The bulk wave excited by the piezoelectric thin film 205 propagates in the planar direction (lateral direction) of the piezoelectric thin film 205 as well. In the piezoelectric thin-film element according to the second embodiment described above, however, the second electrode 202b and first electrode 202a have different areas. Therefore, the acoustic impedance around one of these electrodes is different from the acoustic impedance inside the electrode. Consequently, it is possible to confine the vibration energy in the formation region of the electrode, and suppress a vibration leak in the lateral direction.

In the second embodiment as explained above, the first electrode 202a and the second electrode 202b different in area from the first electrode 202a are affixed, thereby placing the piezoelectric thin film 205 on the acoustic reflection film 204. This makes it possible to strongly integrate the piezoelectric thin film 205 having a high crystallinity and the acoustic reflection film 204, in a state in which a lateral vibration leak is suppressed.

Also, as described above, the piezoelectric thin film 205 is formed from the piezoelectric single-crystal substrate 201 by polishing after bonding. Accordingly, the thickness of the piezoelectric thin film 205 in the vibrating portion (electrode formation region) of the formation region of the first electrode 202a is smaller than that of the piezoelectric thin film 205 in the non-vibrating portion (non-electrode formation region) outside the first electrode 202a in a planar view. Since the vibration energy is confined in the vibrating portion in this arrangement as well, it is possible to suppress a lateral vibration leak, and suppress the occurrence of unnecessary spurious.

Figure 2F:
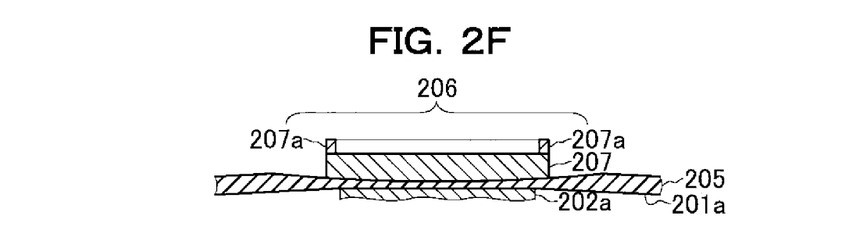
FIG. 2F is a sectional view showing the state of a step for explaining the method of manufacturing a piezoelectric thin-film element according to the second embodiment of the present invention.

Furthermore, as shown in FIG. 2F, an auxiliary electrode 207a may also be formed on the third electrode 207. The auxiliary electrode 207a can be formed in the periphery or in a region close to the periphery of the upper surface of the third electrode 207. Also, the auxiliary electrode 207a need only be formed into a planar shape corresponding to the periphery of the third electrode 207. When the auxiliary electrode 207a is formed on the third electrode 207, it is possible to further confine the vibration energy in the vibrating portion and further suppress the occurrence of unnecessary spurious. The above effect can be obtained more by making the auxiliary electrode 207a as thick as possible. It is possible to appropriately set the formation portion and thickness of the auxiliary electrode 207a in accordance with the occurrence frequency of spurious.

Note that when the vibration energy is confined below the third electrode 207, multiple reflection in the third electrode 207 generates spurious. To suppress this, the planar shape of an overlapping portion of the electrodes sandwiching the piezoelectric thin film 205, i.e., the shape of the first electrode 202a in a planar view can be formed into the shape of an ellipse or the shape of a polygon having no parallel opposing sides.

Figure 3A:
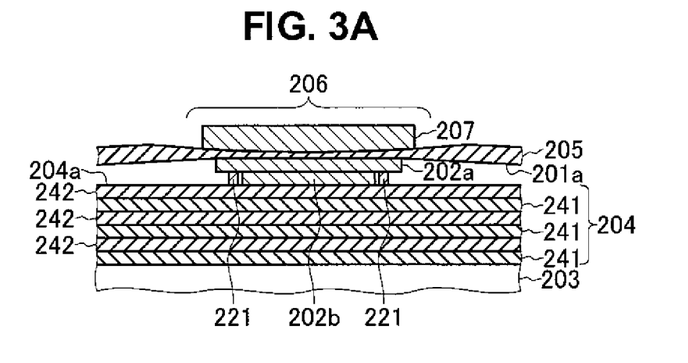
FIG. 3A is a sectional view showing another arrangement example of the piezoelectric thin-film element according to the second embodiment of the present invention.
Figure 3B:
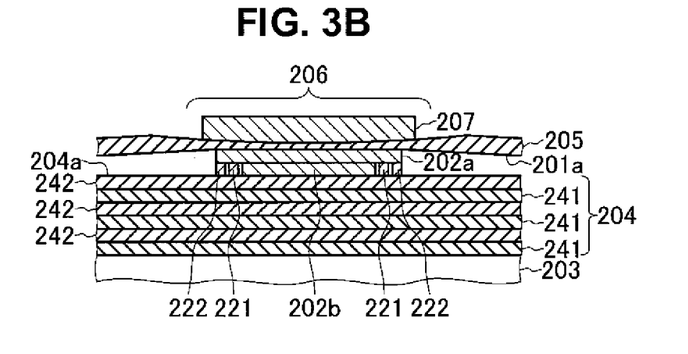
FIG. 3B is a sectional view showing still another arrangement example of the piezoelectric thin-film element according to the second embodiment of the present invention.
Figure 3C:
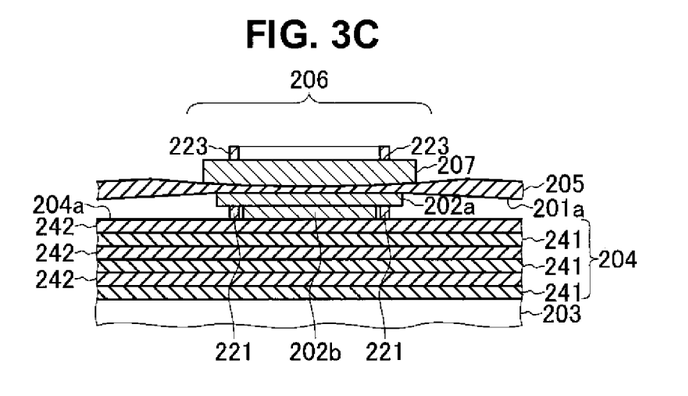
FIG. 3C is a sectional view showing still another arrangement example of the piezoelectric thin-film element according to the second embodiment of the present invention.

When the area of the second electrode 202b is made smaller than that of the first electrode 202a, as shown in FIGS. 3A and 3B, second auxiliary electrodes 221 and 222 can properly be formed and arranged around the second electrode 202b. By thus forming the second auxiliary electrodes 221 and 222, different acoustic impedance regions can be set in a central portion and peripheral portion in a state in which these electrodes are integrated with the first electrode 202a by bonding. When the area of the first electrode 202a is made smaller than that of the second electrode 202b, an auxiliary electrode can be formed around the first electrode 202a. Furthermore, as shown in FIG. 3C, a third auxiliary electrode 223 can be formed on the third electrode 207. The same effect as that of the auxiliary electrode 207a described above is obtained by thus forming the third auxiliary electrode 223.

Also, in the second embodiment, various piezoelectric materials can be selected as the piezoelectric thin film because the piezoelectric thin film is formed without film formation such as deposition. For example, it is possible to use, e.g., ZnO, LiTaO$_3$, LiNbO$_3$, crystal, or KNbO$_3$, instead of AlN described above, as the piezoelectric thin film (piezoelectric single-crystal substrate). Furthermore, a piezoelectric single-crystal substrate having an arbitrary crystal orientation can be selected as the piezoelectric thin film. This increases the degree of freedom of filter design.

Note that the present invention is not limited to the embodiments explained above, and it is obvious to those skilled in the art that many modifications and combinations can be made without departing from the spirit and scope of the invention. For example, the piezoelectric thin-film element of the present invention is also applicable to a duplexer.

Note that this application is an application according to the results of research and development entrusted by the national government (Ministry of Internal Affairs and Communications, 2016 Strategic Information and Communications R & D Promotion Programme).

EXPLANATION OF THE REFERENCE NUMERALS AND SIGNS

101 . . . piezoelectric single-crystal substrate, 101a . . . surface, 101b . . . surface, 102 . . . first electrode, 103 . . . support substrate, 104 . . . acoustic reflection film, 105 . . . piezoelectric thin film, 106 . . . recess, 107 . . . second electrode, 141 . . . high-acoustic-impedance layer, 142 . . . low-acoustic-impedance layer, 201 . . . piezoelectric single-crystal substrate, 201a . . . surface, 201b . . . surface, 202a . . . first electrode, 202b . . . second electrode, 203 . . . support substrate, 204 . . . acoustic reflection film, 204a . . . surface, 205 . . . piezoelectric thin film, 206 . . . recess, 207 . . . third electrode, 241 . . . high-acoustic-impedance layer, 242 . . . low-acoustic-impedance layer

The invention claimed is:

1. A method of manufacturing a piezoelectric thin-film element, comprising:
   a first step of forming, on one surface of a piezoelectric single-crystal substrate made of a single crystal of a piezoelectric material, a first electrode in a predetermined planar shape with an area smaller than that of the piezoelectric single-crystal substrate;
   a second step of affixing, to the first electrode, a multilayered acoustic film consisting of a plurality of layers different in acoustic impedance which are alternately piled;
   a third step of thinning the piezoelectric single-crystal substrate by polishing the piezoelectric single-crystal substrate from the other surface, such that the first electrode and a piezoelectric thin film obtained by thinning the piezoelectric single-crystal substrate are piled on the multilayered acoustic film; and
   a fourth step of forming, on the piezoelectric thin film, a second electrode that faces the first electrode with the piezoelectric thin film in between and has an area smaller than that of the first electrode,
   wherein in the third step, an electrode formation region of the piezoelectric thin film, where the first electrode is formed, is made thinner than a non-electrode formation region, where the first electrode is not formed, by a polishing pressure difference between the electrode formation region and the non-electrode formation region.

2. The method of manufacturing piezoelectric thin-film element according to claim 1,
   wherein in the first step, a dummy electrode that is irrelevant to vibration of the piezoelectric thin film is formed around the first electrode on one surface of the piezoelectric single-crystal substrate such that the dummy electrode is isolated from the first electrode,
   wherein the electrode formation region includes a region where the first electrode and the dummy electrode are formed.

3. A method of manufacturing a piezoelectric thin-film element, comprising:
   a first step of forming, on one surface of a piezoelectric single-crystal substrate made of a single crystal of a piezoelectric material, a first electrode in a predetermined planar shape with an area smaller than that of the piezoelectric single-crystal substrate;
   a second step of forming a second electrode that has an area different from that of the first electrode on one surface of a multilayered acoustic film consisting of a plurality of layers different in acoustic impedance which are alternately piled;
   a third step of affixing the first electrode and the second electrode to each other;
   a fourth step of thinning the piezoelectric single-crystal substrate, such that the second electrode, the first electrode, and a piezoelectric thin film obtained by thinning the piezoelectric single-crystal substrate are piled on the multilayered acoustic film, wherein the piezoelectric thin film is obtained by thinning the piezoelectric single-crystal substrate from the other surface of the piezoelectric single-crystal substrate by polishing, and an electrode formation region where the first electrode is formed is preferably made thinner than a non-electrode formation region around the electrode formation region, where the first electrode is not formed, by a polishing pressure difference between the electrode formation region and the non-electrode formation region; and a fifth step of forming, on the piezoelectric thin film, a third electrode that faces the first electrode with the piezoelectric thin film in between and has an area larger than that of the first electrode.

\* \* \* \* \*